United States Patent
Satoh et al.

(10) Patent No.: US 7,510,990 B2
(45) Date of Patent: Mar. 31, 2009

(54) SPUTTERING TARGET, OPTICAL THIN FILM AND MANUFACTURING METHOD THEREOF USING THE SPUTTERING TARGET, AND OPTICAL RECORDING MEDIUM

(75) Inventors: Yasuhiro Satoh, Yokohama (JP); Tsukasa Nakai, Hino (JP); Sumio Ashida, Yokohama (JP); Shoko Suyama, Kawasaki (JP); Yoshiyasu Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 343 days.

(21) Appl. No.: 11/368,685

(22) Filed: Mar. 7, 2006

(65) Prior Publication Data

US 2007/0031633 A1  Feb. 8, 2007

(30) Foreign Application Priority Data

Jul. 8, 2005  (JP)  ............................ P2005-200782

(51) Int. Cl.
*C04B 35/565*  (2006.01)
(52) U.S. Cl. .................... 501/88; 501/89; 204/298.13
(58) Field of Classification Search ................. 501/88, 501/89; 204/298.13
See application file for complete search history.

(56) References Cited

U.S. PATENT DOCUMENTS

| 6,800,182 | B2 * | 10/2004 | Mitsui et al. ............ 204/298.13 |
| 7,141,309 | B2 * | 11/2006 | Kinoshita et al. ......... 428/539.5 |
| 7,235,506 | B2 * | 6/2007 | Suyama et al. ................. 501/88 |
| 2002/0117785 | A1 * | 8/2002 | Mitsui et al. ................. 264/643 |
| 2005/0025035 | A1 | 2/2005 | Nakai et al. |
| 2005/0255335 | A1 | 11/2005 | Suyama et al. |
| 2005/0258033 | A1 * | 11/2005 | Kumagai et al. ....... 204/298.13 |
| 2006/0032739 | A1 * | 2/2006 | Ikeda et al. ............ 204/192.23 |

FOREIGN PATENT DOCUMENTS

| CN | 1 577 553 | 2/2005 |
| EP | 1 561 737 | 8/2005 |
| JP | 2003-119077 | 4/2003 |
| JP | 2004-018322 | 1/2004 |
| JP | 2005-025851 | 1/2005 |
| WO | 2004/007401 | 1/2004 |

* cited by examiner

*Primary Examiner*—Karl E Group
(74) *Attorney, Agent, or Firm*—Nixon & Vanderhye, PC

(57) ABSTRACT

A sputtering target contains Si and C as its major components and includes a texture in which a Si phase continuously exists in a net shape in gaps among SiC crystal grains. An average diameter of the Si phase is controlled to 1000 nm or less. The sputtering target is sputtered in an oxygen-containing gas, thereby depositing an optical thin film containing Si and O as its major components, and a third element other than the major components, a total amount of the third element being within a range from 10 to 2000 ppm.

10 Claims, 3 Drawing Sheets

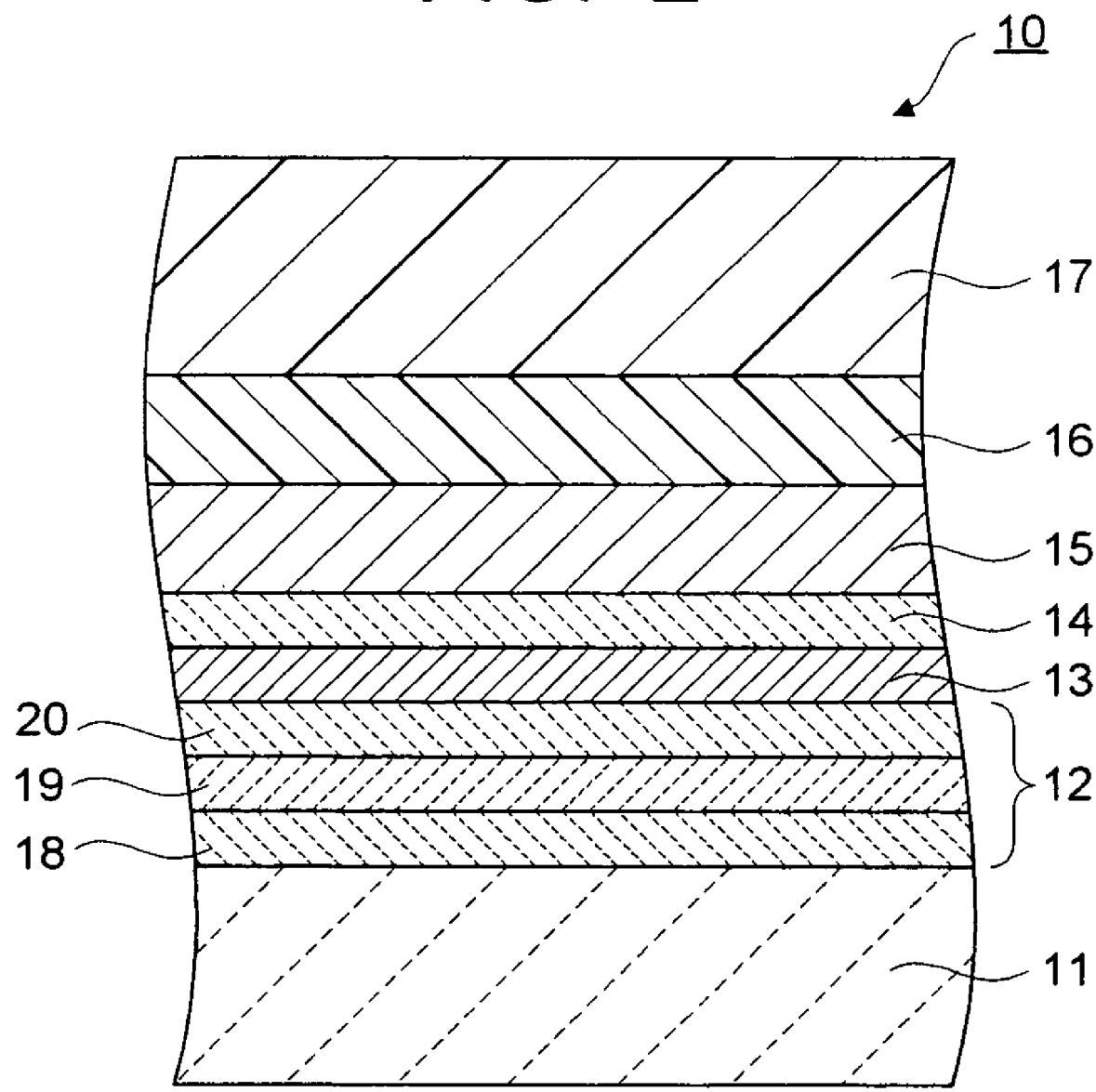

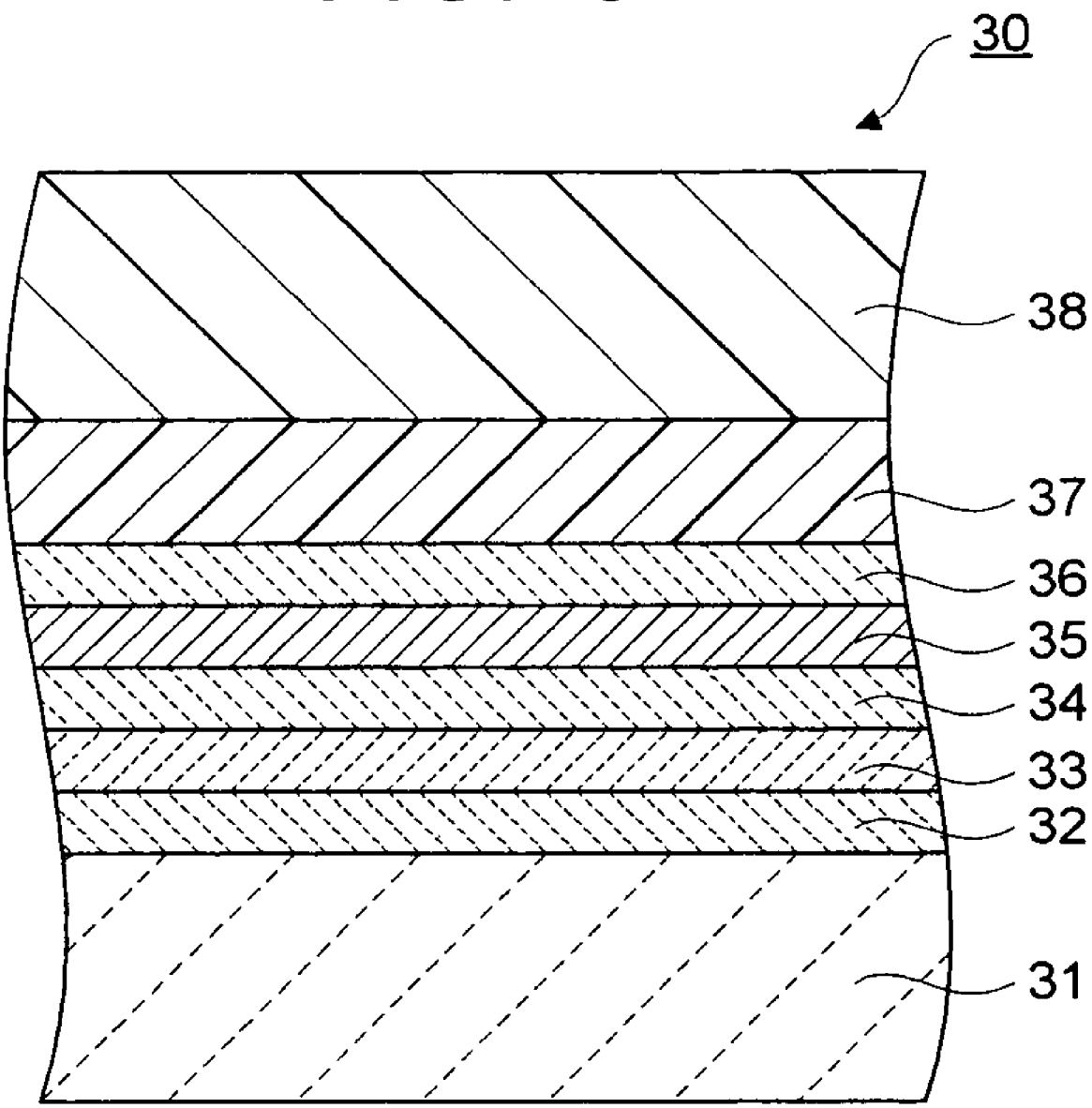

SPUTTERING TARGET, OPTICAL THIN FILM AND MANUFACTURING METHOD THEREOF USING THE SPUTTERING TARGET, AND OPTICAL RECORDING MEDIUM

CROSS-REFERENCE TO RELATED APPLICATIONS

This application is based upon and claims the benefit of priority from the prior Japanese Patent Application No.2005-200782, filed on Jul. 8, 2005; the entire contents of which are incorporated herein by reference.

BACKGROUND

1. Field of the Invention

The present invention relates to a sputtering target, an optical thin film and a manufacturing method thereof using the sputtering target, and an optical recording medium.

2. Description of the Related Art

A SiC thin film is used in a dielectric layer, a protective layer, a light absorbing layer, and so on of a conventional optical recording medium. However, the SiC thin film is opaque for light in the visible spectrum and exhibits a low transmittance for light even in the red spectrum. Further, the SiC thin film absorbs much of light in the blue-violet spectrum used for a next-generation high-density optical disk and thus scarcely transmits the light.

In a next generation high-density rewritable optical disk using a blue-violet laser, effective is a so-called low-to-high polarity medium which exhibits a higher reflectance when data is recorded thereon than when no data is recorded thereon. A known approach to achieve a low-to-high polarity optical disk is the following film structure. That is, in a structure having a first dielectric film, a phase-change recording film, a second dielectric film, and a reflection film stacked in the order from a light incident side, the first dielectric film is constituted of a multilayer dielectric film having a high refractive-index dielectric film, a low refractive-index dielectric film, and a high refractive-index dielectric film A $SiO_2$ film is generally used as the low refractive-index dielectric film since the lower the refractive index of the low refractive-index dielectric film is, the better. Known film deposition methods of the $SiO_2$ film are a sputtering method using a $SiO_2$ target, a reactive sputtering method using a Si target, and the like. The former method, however, has problems of a very low film deposition rate and a great increase in substrate temperature. The latter method has a problem that conductivity is lowered due to the oxidization of a surface of the Si target during the sputtering, which inhibits the continuation of stable sputtering. Because of these reasons, the sputtering method of using the $SiO_2$ target and the reactive sputtering method using the Si target are not suitable for mass production.

Meanwhile, a SiOC film formed by reactively sputtering a sputtering target containing Si and C as its major components in an oxygen-containing rare gas atmosphere is known as being transparent and having a low refractive index, though still having a slight absorption coefficient for light in the blue-violet spectrum (see Japanese Patent Laid-open Application No. 2005-025851). Owing to its high deposition rate and excellent mass productivity, the SiOC film formed by using the target containing Si and C as its major components is expected as a low refractive-index dielectric film of an optical recording medium. However, since sufficient consideration has not been given to its texture, composition, and the like, a conventional SiC target has a problem of easily cracking and easily causing abnormal discharge, which leads to a defect of the film. The abnormal discharge will be a cause of variation in characteristics among media.

One of possible reasons for this may be that SiC is a very high melting-point material and is thus poor in sinterbility. Accordingly, the SiC target is difficult to have a high density structure, and therefore has alow strength to easily crack. Further, the produced sputtering target has a coarse texture, which tends to cause abnormal discharge starting from pores in the target. Known approaches to achieve the higher density of the Si target are a method of sintering SiC raw material powder under conditions of a high temperature of about 2000° C. and a high pressure, and a method of adding a sintering aid to the SiC raw material powder. The former method, however, requires high cost, which will be a cause of increasing manufacturing cost of the SiC target.

The latter method of achieving the higher density uses metal elements such as Al and Fe as the sintering aid. Meanwhile, raw material powder of SiC commonly available has purity of about 2N to 3N, and the raw material powder contains, besides Si and C being the major components, elements functioning as the sintering aid and elements not having such a function. Therefore, if no consideration is given to the kind and amount of impurity elements in the target, the impurity elements are very much likely to be a starting point of the abnormal discharge. As a result, the abnormal discharge of ten occurs during the sputtering.

Moreover, if the target contains too large an amount of the sintering aid, components (metal elements such as Al and Fe) of the sintering aid are excessively taken in the film deposited by the sputtering, which increases the absorption of the SiOC film. The use of such a SiOC film in an optical recording medium causes a problem of an insufficient signal strength. In order to solve the problems ascribable to the conventional SiC target, the texture, Purity, manufacturing method, and the like of the target have to be improved, but at present, no industrially effective solution has been found yet.

A next generation phase-change optical recording medium adopts a method of narrowing a track pitch in order to improve its recording density. Such a phase-change optical recording medium has a problem that so-called cross erase is likely to occur. The cross erase refers to a phenomenon that in an area where the track pitch is substantially equal to or smaller than the size of an optical beam, data recorded to a certain track is deteriorated when data is recorded to or erased from an adjacent track. A possible cause of the occurrence of the cross erase is that the relevant track is also exposed to an edge of an optical beam with a considerably high light intensity when the adjacent track is irradiated with the optical beam, and only an effect of the light irradiation deteriorates recorded marks on the relevant track. Another possible cause may be that heat generated when the adjacent track is heated by the optical beam is transferred to the relevant track by heat transfer in an inward direction on a film plane, and the influence thereof deteriorates the shape of the recorded marks.

An effective solution to the cross erase due to the former cause is a film structure in which a light absorption ratio Aa of an amorphous portion (recorded portion) is made smaller than a light absorption ratio Ac of a crystalline portion (unrecorded portion). In order to satisfy Aa<Ac, the adoption of the film structure having the aforesaid low-to-high polarity is effective. The aforesaid patent publication describes this film structure and further describes that adopting a SiOC film whose C concentration is 0.1 to 30 atom % as the low refractive-index dielectric film achieves the low-to-high signal polarity and improves thermal conductivity of the film owing to carbon(C). The improved thermal conductivity of the SiOC film enables the heat caused by the laser beam irradiation to be effectively transferred in a direction perpendicular to the film plane. As a result, the cross erase can be further reduced.

The aforesaid patent publication describes that the SiOC film whose C concentration is within the range from 0.1 atom % to 30 atm % exhibits optical characteristics of $1.45<n<1.55$ and $k<0.01$ for light in the blue-violet wavelength spectrum when a complex refractive index is expressed as n-ik (n: refractive index, k: attenuation coefficient). However, the attenuation coefficient k of 0.01 or lower is not small enough to obtain an optical recording medium having a sufficient reflectance contrast. Therefore, there is a demand for a dielectric film which maintains the effect of reducing the cross erase on one hand and has a further reduced attenuation coefficient k on the other.

The SiOC film is applicable not only to the low refractive-index dielectric film of the phase-change optical recording medium but also to optical thin films such as a dielectric film of a write-once optical recording medium, and an antireflection film, a selective transmissive film, an interference film, a polarizing film, and the like of various kinds of parts and members. For example, in a write-once optical recording medium that records data by an irreversible optical change, an organic dye is mainly used as a material of a recording film. Generally, an organic dye film (recording film) is formed on a resin substrate such as a polycarbonate substrate, and a metal reflection film is further provided thereon. However, if the metal reflection film in contact with the organic dye is thin, sufficient thermal conductivity cannot be obtained. This poses a problem that heat caused by an applied laser pulse does not quickly diffuse, so that the shape of the recorded marks is deteriorated.

Another problem is that, when the organic dye is applied on the substrate, the polycarbonate substrate is influenced by a solvent which is blended for improving coatability of the organic dye, so that the recording film is gradually deteriorated when it is kept under a high-temperature environment. Further, when a so-called blue-violet laser with a wavelength of about 405 nm is used as a light source, a silver-series material is best suited for sufficiently increasing a reflectance. However, manufacturing cost of an optical disk is increased because silver is expensive. Reducing the thickness of the reflection film with in order to cut down the manufacturing cost causes problems of deteriorated thermal conductivity and deteriorated shape of the recorded marks. In addition, the recording film made of the organic dye is directly formed on a surface of the substrate by a spin coating method of the like. Therefore, it has a problem that, when it is kept under high-temperature and higher-humidity conditions for a long time, the solvent in the organic dye reacts with the substrate to cause gradual deterioration of its recording characteristic.

An effective solution to these problems is to provide a low refractive-index SiOC film between the resin substrate and the organic dye film (recording layer). The SiOC film has a refractive index approximate to that of the resin substrate and thus unnecessary light reflection on an interface is small, so that optical problems do not easily occur. From a viewpoint of mass productivity, the SiOC film is also preferably formed by reactively sputtering a sputtering target containing Si and C as its major components in an oxygen-containing gas atmosphere, similarly to the SiC film used in the phase-change optical recording medium. However, this still has a problem that characteristic variation among media is likely to occur due to the abnormal discharge ascribable to the conventional SiC target.

The adoption of the SiOC film as an optical thin film such as an antireflection film, a light-selective transmissive film, an optical interference film, or a polarizing film has a problem that the impurity elements contained in the conventional SiC target are excessively taken in the film deposited by the sputtering, so that the absorption is increased. Since the impurities in the film originating in the conventional SiC target include the sintering aid necessary for achieving the higher density of the target, the absorption of the film greatly increases, so that the film transmits substantially no light in the ultraviolet spectrum.

SUMMARY

The present invention may provide a sputtering target containing Si and C as its major components, which is made more difficult to crack during film deposition and can suppress the occurrence of abnormal discharge, according to an aspect of the present invention or embodiments consistent with the present invention. The present invention may provide an optical thin film with high mass productivity owing to its film deposition rate and with reduced absorption and a manufacturing method of the thin film according to an aspect of the present invention or embodiments consistent with the present invention. The present invention may provide an optical recording medium which can be manufactured at low cost, in which the absorption of a dielectric film is reduced, whose medium characteristics are enhanced, and which realizes reduced variation in the medium characteristics, according to an aspect of the present invention or embodiments consistent with the present invention.

A sputtering target according to one embodiment of the present invention is a sputtering target containing silicon (Si) and carbon (C) as major components, and including a texture having silicon carbide (SiC) crystal grains and a silicon (Si) phase which continuously exists in a net shape in gaps among the silicon carbide (SiC) crystal grains and whose average diameter is 1000 nm or less.

An optical thin film according to one embodiment of the present invention includes a thin film which is deposited by sputtering the sputtering target according to the aforesaid embodiment of the present invention in an oxygen-containing gas, which contains silicon (Si) and oxygen (O) as major components, and a third element other than the major components, a total amount of the third element being within a range from 10 ppm to 2000 ppm.

A manufacturing method of an optical thin film according to one embodiment of the present invention includes: sputtering the sputtering target according to the aforesaid embodiment of the present invention in an oxygen-containing gas to deposit a thin film containing silicon (Si) and oxygen (O) as major components.

An optical recording medium according to one embodiment of the present invention includes: a phase-change recording film to/from which reversible recording/erase is performed by light irradiation; and a multilayer dielectric film disposed on a light incident side of the phase-change recording film and having a first high refractive-index dielectric film, a low refractive-index dielectric film, and a second high refractive-index dielectric film which are stacked in sequence. The low refractive-index dielectric film includes a thin film which is deposited by sputtering the sputtering target according to the aforesaid one embodiment of the present invention in an oxygen-containing gas, which contains silicon (Si) and oxygen (O) as major components, and a third element other than the major components, a total amount of the third element being within a range from 10 ppm to 2000 ppm.

An optical recording medium according to another embodiment of the present invention includes: a recording film to which irreversible recording is performed by light irradiation; and a dielectric film stacked with the recording film. The dielectric film includes a thin film which is deposited by sputtering the sputtering target according to the aforesaid one embodiment of the present invention in an oxygen-containing gas, which contains silicon (Si) and oxygen (O) as major components, and a third element other than the major components, a total amount of the third element being within a range from 10 ppm to 2000 ppm.

BRIEF DESCRIPTION OF THE DRAWINGS

FIG. 2 is a cross-sectional view showing a structure of a phase-change optical recording medium according to one embodiment of the present invention FIG. 3 is a cross-sectional view showing a structure of a write-once optical recording medium according to one embodiment of the present invention.

DETAILED DESCRIPTION

Figure 1:
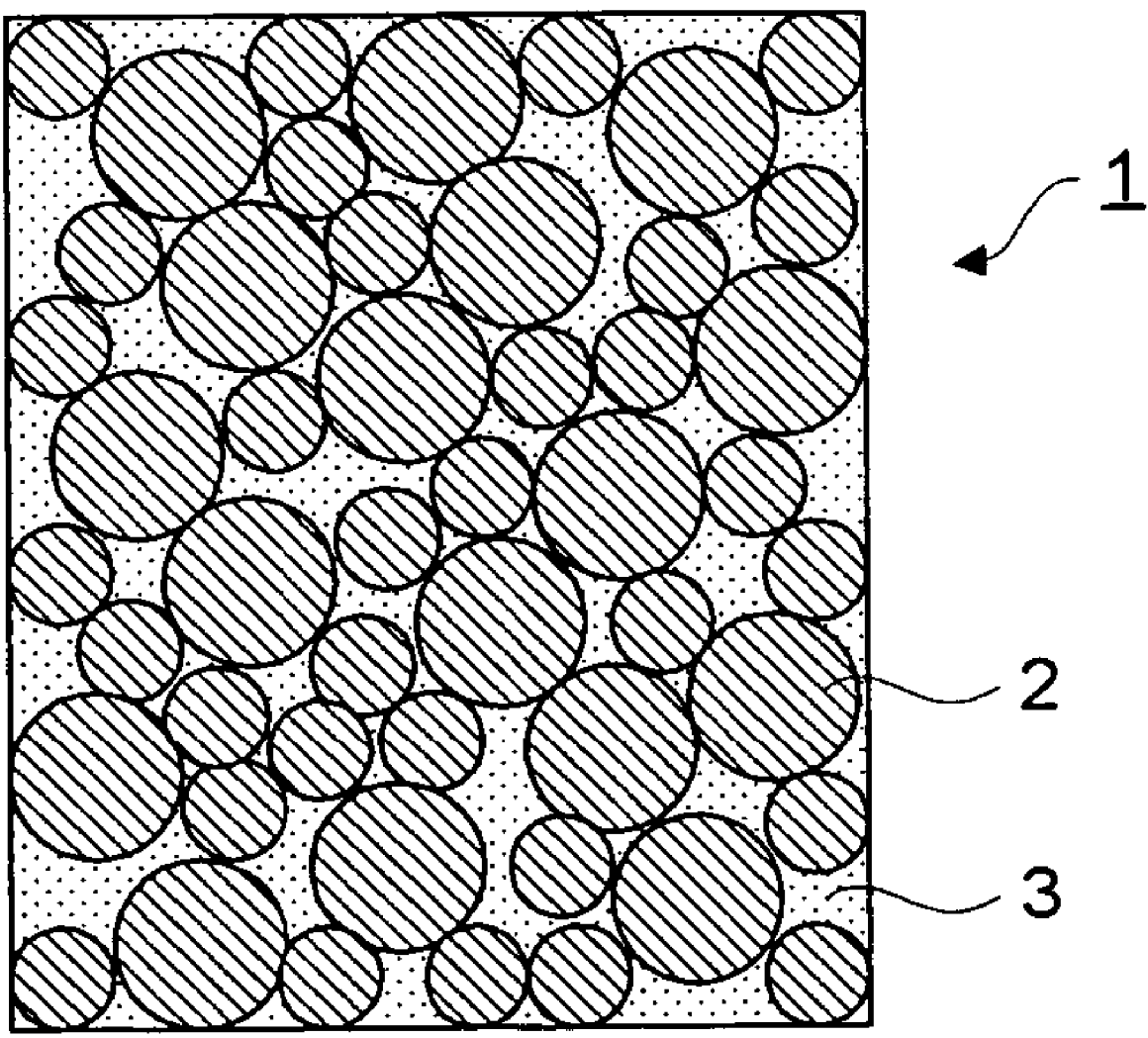
FIG. 1 is an enlarged cross-sectional view schematically showing a texture of a sputtering target according to one embodiment of the present invention.

Hereinafter, embodiments of the present invention will be described with reference to the drawings. It should be noted that, though the embodiments of the present invention will be described below based on the drawings, these drawings are presented only for an illustrative purpose and in no way limit the present invention.

A sputtering target according to one embodiment of the present invention contains Si and C as its major components, and includes, for example, a sintered body. FIG. 1 schematically shows a texture of the sputtering target of this embodiment (hereinafter, referred to as a SiC-based target). The SiC-based target 1 of this embodiment has a texture in which Si phase (free Si phase) 3 continuously exists in a net shape in gaps among SiC crystal grains 2. The higher density of the SiC-based target 1 can be achieved with a minute amount of a sintering aid owing to the Si phase 3 existing in the gaps among the SiC crystal grains 2. Therefore, the higher density and higher purity of the SiC-based target 1 can both be achieved.

The target texture including the SiC crystal grains 2 and the free Si phase 3 can be observed with an EPMA (Electron Probe Micro-Analyzer), an EDX (Energy Dispersive X-ray Fluorescence Spectrometer), a SEM (Scanning Electron Microscope), a TEM (Transmission Electron Microscope), or the like.

The higher density of the SiC-based target leads to an increased strength. Therefore, the use of the SiC-based target for film deposition by sputtering can prevent the target from cracking. Concretely, it is preferable that porosity of the SiC-based target is 5% or lower. The target whose porosity exceeds 5% has an insufficient strength, so that it easily cracks when being sputtered. In addition, it tends to cause abnormal discharge. The porosity of the SiC-based target is more preferably 2% or lower, and still more preferably, 1% or lower. The porosity of the target is defined as a value calculated based on the expression: [porosity (%)=(1−d1/d0)× 100], where d1 is a measured density, which is measured by the Archimedean method of water displacement, and d0 is a theoretical density (3.2 g/cm$^3$).

Further, as for a concrete strength of the SiC-based target, its bending strength is preferably 500 MPa or more. The SiC-based target whose bending strength is less than 500 MPa easily cracks when being sputtered, and thus is not suitable for mass production. Such a strength as well as density of the SiC-based target can be obtained with good repeatability by controlling later-described content and average diameter of the Si phase. Note that the bending strength of the target is defined as a value measured by the following method. That is, the target is worked into a bending test piece with 40 mm length×4 mm width×3 mm thickness and this bending test piece is subjected to a three-point bending test under room temperature. The measured value of this test is defined as the bending strength.

In the SiC-based target having the texture shown in FIG. 1, the content of the Si phase 3 is preferably within a range from 5 to 50 mass %. The content less than 5 mass % of the Si phase 3 may possibly cause deterioration in density and strength of the SiC-based target. It is important for the Si phase 3 to continuously exist in the net shape (network shape) in the gaps among the SiC crystal grains 2, but if the content of the Si phase 3 is too small, the structure (network structure) is likely to become discontinuous, so that pores tend to be formed. Further, the strength of the SiC-based target is also lowered.

On the other hand, if the content of the Si phase 3 exceeds 50 mass %, the strength of the SiC-based target may possibly be lowered. Specifically, since the Si phase 3 has a lower strength than the SiC crystal grains 2, the Si phase 3 may possibly be starting points of breakage to lower the strength of the SiC-based target. An amount of the Si phase 3 in the texture of the target is more preferably within a range from 5 to 25 mass % which can achieve a still higher strength of the SiC-based target.

The Si phase 3 preferably exists in a minute size uniformly in the gaps among the SiC crystal grains 2. From this point of view, an average diameter of the Si phase 3 is controlled to 1000 nm or smaller. The average diameter of the Si phase 3 corresponds to an average distance between the SiC crystal grains 2. If the average diameter of the Si phase 3 exceeds 1000 nm, their distribution becomes nonuniform and segregation occurs. Since the Si phase 3 has a lower strength than the SiC crystal grains 2, the segregated Si phase 3 will be a cause of lowering the strength of the SiC-based target.

Moreover, the segregation of the Si phase 3 tends to cause the occurrence of the abnormal discharge. The segregated Si phase 3 has a lower melting point than the SiC crystal grains 2, and in addition, is easily oxidized when the sputtering is applied in an oxygen-containing atmosphere. These factors will be causes of the occurrence of the abnormal discharge. A small average diameter of the Si phase 3 implies that the Si phase 3 which might be the starting points of the breakage and the cause of the occurrence of the abnormal discharge are made minute. Therefore, it is possible to provide a SiC-based target with a high strength and with reduced occurrence of the abnormal discharge. The average diameter of the Si phase 3 is more preferably 100 nm or less.

The average diameter of the Si phase 3 is calculated as follows. First, the texture of the target is imaged with an EPMA, and SEM or TEM, and image processing is applied to the image. After the Si phase and the SiC phase are separated, an average size value of the Si phase is calculated. The area of each Si-phase region differs, and therefore, an average value thereof is calculated as the average diameter. When the average diameter of the Si phase is small as in the SiC-based target of this embodiment, the TEM is preferably used for imaging the target texture.

The higher density of the SiC-based target of this embodiment can be achieved with a minute amount of a sintering aid owing to the above-described target texture. As the sintering aid of the SiC-based sintered body, used is, for example, a metal element of at least one kind selected from Al, Fe, Zr, and Sn. Among them, Al and Fe are especially effective. Such metal elements contribute to the achievement of the higher density of the sintered body in a process of sintering SiC, but after the sintering, they will become impurity elements in the target to be a factor of causing the occurrence of the abnormal discharge. Therefore, an amount of the sintering aid to be added is preferably reduced within a value range capable of realizing the higher density of the SiC-based target.

According to this embodiment, the higher density of the SiC-based target can be achieved with a minute amount of the sintering aid. Concretely, the total content of a third element other than Si and C which are the major components of the SiC-based target, can be within a range from 10 to 2000 ppm (mass ratio). The third element mentioned here refers to an added element, and not an impurity element unavoidably contained in the raw material powder and the like of the SiC-based-target. A possible concrete example of such a third element is a metal element of at least one kind selected from the aforesaid Al, Fe, Zr, and Sn. Among them, the use of an element of at least one kind selected from Al and Fe is especially preferable.

When the content of the third element (metal element) functioning as the sintering aid of the SiC falls within the range from 10 to 2000 ppm, the impurities which might be a starting point of the abnormal discharge of the sputtering target can be reduced. Accordingly, it is possible to prevent the abnormal discharge from occurring while the SiC-based target is sputtered. According to the SiC-based target of this embodiment, the abnormal discharge during the sputtering is prevented owing to the above-described target texture and content of the third element. Consequently, defects and characteristic variation of sputtering films (later-described SiOX films) can be reduced, which can realize higher mass productivity.

If the total amount of the third element contained in the SiC-based target exceeds 2000 ppm, a reaction product is produced in the sintering process, which tends to cause the occurrence of the abnormal discharge during the sputtering. On the other hand, if the total amount of the third element is less than 10 ppm, sinterbility of the SiC is deteriorated, which makes it difficult to realize the higher density of the SiC-based target even if it has the above-described texture. Further, in order to adjust the total amount of the third element to less than 10 ppm, processing such as increasing the purity of the raw material powder is required, which leads to an increase in manufacturing cost. The total content of the third element is more preferably within a range from 10 to 1000 ppm (mass ratio). The content of the third element can be examined by using ICP analysis, SIMS, X-ray fluorescence spectrometry, or the like.

Incidentally, the raw material powder and organic binder of the SiC-based target sometimes contain a minute amount of unavoidable impurity elements besides the intentionally added elements such as Al and Fe. The raw material powder of the SiC-based target sometimes contains metal elements such as Ca, Na, Mg, and Ni, and the organic binder sometimes contains a halogen element and the like. Such unavoidable impurity elements are sometimes taken in the SiC-based target, but the existence thereof does not depart from the spirit of the present invention.

The sputtering target of this embodiment is excellent in film deposition rate in an oxygen-containing atmosphere owing to its major components Si and C. Here, if high power is applied to a conventional SiC-based target in order to increase the deposition rate, abnormal discharge in particular often occurs. On the other hand, the SiC-based target of this embodiment is superior in mechanical strength as described above and in addition, high in purity, and thus is excellent also in thermal conductivity. According to such a SiC-based target high in thermal conductivity, it is possible to further suppress the rise of the substrate temperature. This allows the application of high power to the SiC-based target when it is sputtered, so that the deposition rate can be further increased. That is, mass productivity in the film deposition process can be enhanced.

The SiC-based target having the above-described texture can be fabricated by applying a method of reactively sintering the. SiC. That is, the sputtering target of this embodiment preferably includes a SiC-based sintered body fabricated by the reactive sintering method. Other methods applicable to the fabrication of the SiC-based sintered body are an atmosphere pressure sintering method, a hot press method, a hot isotropic press method, and the like. These sintering methods, however, require the temperature rise nearly to 2000° C. which is a melting point of SiC, resulting in an increase in manufacturing cost of the SiC-based target. Further, since a large amount of the sintering aid is necessary, the purity of the target becomes low.

The reactive sintering method only requires the temperature rise approximately to 1400° C. which is a melting point of metal Si, and can also achieve the higher density only with a small amount of the sintering aid. Therefore, cost reduction and higher purity of the SiC-based target can both be achieved. The SiC-based target to which the reactive sintering method is applied is fabricated, for example, in the following manner. First, high-purity SiC powder and carbon powder, and Fe powder, Al powder, and so on which are added as the third element are mixed with an appropriate amount of an organic binder. This mixture is dispersed in a solvent to fabricate low-viscosity slurry.

Next, by using a pressure slip casting device or the like, the aforesaid slurry is filled in a mold while being pressed, so that a molded body is fabricated. After being dried, this molded body is heated to a temperature of about 600° C. in an inert gas atmosphere, so that an organic binder component is eliminated therefrom (defatting). Subsequently, the molded body is heated to a temperature of 1400° C. or higher under a reduced pressure or in an inert gas atmosphere, and the heated molded body is impregnated with the melted metal Si. The molded body is reactively sintered in this process of impregnating the melted Si, so that the SiC-based sintered body to be a target material is fabricated., In the aforesaid impregnation process of the melted Si, the carbon powder in the molded body reacts with the melted Si under the high temperature, so that minute SiC crystal grains are produced. On the other hand, the SiC powder in the molded body makes substantially no grain growth. Therefore, it is possible to obtain the texture in which SiC crystal grains with a relatively large grain size and minute SiC crystal grains produced in the reactive sintering process both exist. Therefore, the gaps themselves among the SiC crystal grains become minute and uniform. In such gaps among the SiC crystal grains, the Si not involved in the reaction continuously exists in a net shape as the free Si phase.

The application of such a reactive sintering method makes it possible to obtain the SiC-based sintered body having a high-density and minute texture. When the reactive sintering method is applied to the fabrication of the SiC-based sintered body, the grain size of the SiC powder and carbon powder as starting raw materials, the density of the molded body, and the like are adjusted. This enables the control of the average diameter and the content of the free Si phase. Then, such a SiC-based sintered body is mechanically worked into a desired target shape, so that the sputtering target (SiC-based target) of this embodiment can be obtained.

Next, an embodiment of a manufacturing method of an optical thin film using the SiC-based target of the above-described embodiment and the optical thin film will be described. A manufacturing process of the optical thin film of this embodiment includes sputtering the above-described SiC-based target in an oxygen-containing gas. As the sputtering gas, used is, for example, a mixed gas of an inert gas such as an argon gas with an appropriate amount of oxygen added thereto. Through such a sputtering process, the thin film containing Si and O as its major components is deposited. This thin film contains a third element X other than Si and O which are the major components, the total content of the third element X being within the range from 10 to 2000 ppm (mass ratio).

As described above, in the SiC-based target, the content of the metal element functioning as the sintering aid is reduced. Therefore, the thin film deposited by sputtering the SiC-based target has a reduced content of the third element X. The third element X contained in the thin film includes the metal element (an element of at least one kind selected from Al, Fe, Zr, and Sn) added to the SiC-based target as the sintering aid, carbon (C) as a constituent element of the SiC-based target, nitrogen (N) taken from the sputtering gas, and so on.

The thin film containing Si and O as its major components and the third element X whose content is within the range from 10 to 2000 pm (hereinafter, referred to as a SiOX thin film) has excellent characteristics as an optical thin film. As for the metal elements such as Al and Fe in the third element X contained in the SiOX thin film, an amount thereof contained in the SiOX thin film is also reduced because an amount of the sintering aid itself added to the SiC-based target is reduced. As for the carbon as a constituent element of the SiC-based target, an amount thereof contained in the SiOX thin film can be also reduced. Note that, even if a minute amount of the aforesaid impurity element unavoidably contained in the SiC-based target is taken in the SiOX thin film, it does not depart from the spirit of the present invention.

Controlling the total amount of the aforesaid third element X to 2000 ppm or less can reduce the absorption of the SiOX thin film used as the optical thin film. In view of further reducing the absorption of the SiOX thin film, the content of the third element X is more preferably 1000 ppm or less. The third element X, if existing in the SiOX thin film in large amount, will be a cause of increasing the absorption. However, a minute amount of the third element X contributes to the improvement of controllability of the film texture and the like. For example, in the SiOX thin film containing the third element X whose content is within the range from 10 to 2000 ppm, an orientation state can be controlled owing to the existence of the third element X.

Thus controlling the orientation state of the SiOX thin film makes it possible to provide a highly functional optical thin film. If the content of the third element X is less than 10 ppm, the orientation state and the like of the SiOX thin film cannot be controlled. Further, the film deposition cost of the SiOX thin film is increased due to the cost required for achieving excessively high purity. The content of the third element X is more preferably within the range from 10 to 1000 ppm (mass ratio).

Since only a minute amount of the third element X other than the major components is taken in the SiOX thin film, the SiOX thin film has only small absorption and is capable of maintaining a high transmittance for light up to the ultraviolet spectrum. Such a SiOX thin film is suitable for optical thin films such as a low refractive-index dielectric film of a phase-change optical recording medium, a dielectric film of a write-once optical recording medium, and the like. Further, the SiOX thin film is applicable not only to the dielectric films of the optical recording media but also to optical thin films such as an antireflection film, a light-selective transmissive film, an optical interference film, and a polarizing film of various kinds of parts and members. The film deposition process of the SiOX thin film of this embodiment using the SiC-based target is applicable to manufacturing processes of various kinds of optical thin films.

The SiOX thin film of this embodiment contains a minute amount of the third element X other than the major components, so that it is possible to control the film texture, for example, the orientation state of the film by the sputtering process. It is also possible to eliminate the orientation of the film. Therefore, according to this embodiment, it is possible to provide a high-quality SiOX film as an optical thin film. In addition, the manufacturing method of the optical thin film of this embodiment is excellent in mass productivity since it reduces abnormal discharge occurring during the sputtering and makes the target difficult to crack.

Incidentally, the control of the film texture by the film deposition process cannot be done in the film deposition process of a $SiO_2$ film using a $SiO_2$ target. Further, when the conventional target containing Si and C as its major components is used, impurity elements locally exist in the film deposited by sputtering since the target contains a relatively large amount of impurities. The film texture of such a film (SiO-based thin film) is difficult to control by the film deposition process.

Next, a first embodiment of an optical recording medium of the present invention will be described. The description here will be on an embodiment in which the sputtering target of the above-described embodiment and the manufacturing method of the optical thin film using the same are applied to a phase-change optical recording medium. The phase-change optical recording medium may be a single-layer medium or may be a single-side dual-layer medium. In either case, the phase-change optical recording medium includes as its basic structure a multilayer film in which a first dielectric film, a phase-change recording film, a second dielectric film, and a metal reflection film are stacked in this order from a light incident side.

FIG. 2 is a cross-sectional view showing a structure of one embodiment of the phase-change optical recording medium of the present invention. A phase-change optical recording medium 10 shown in FIG. 2 has a transparent substrate 11 such as a polycarbonate substrate disposed on the light incident side. On the transparent substrate 11, a first dielectric film 12, a phase-change recording film 13 to/from which reversible recording/erase is performed by light irradiation, a second dielectric film 14, and a metal reflection film 15 are stacked in this order. A laminated substrate 17 is laminated on the metal reflection film 15 via an ultraviolet curable resin layer 16. They constitute the phase-change optical recording medium 10.

As the phase-change recording film 13, used is GeSbTeBi, GeSbTe, GeBiTe, GeSbTeSn, AgInSbTe, InSbTe, AgInGeSbTe, GeInSbTe, or the like. An interface layer of GeN, CrO, SiN, or the like may be provided on each of upper and lower sides or on one side of the phase-change recording film 13. The first dielectric film 12 disposed on the light incident side of the phase-change recording film 13 is constituted of a multilayer dielectric film in which a first high refractive-index dielectric film 18, a low refractive-index dielectric film 19, and a second high refractive-index dielectric film 20 ate stacked in this order.

The low refractive-index dielectric film 19 includes the thin film that is deposited by sputtering the SiC-based target of the above-described embodiment in the oxygen-containing gas. This thin film is a SiOX thin film that contains Si and C as its major components and contains the third element X other than the major components, the total content of the third element X being within the range from 10 to 2000 pm (mass ratio). The X element is preferably at least one kind selected from Al, Fe, Zr, Sn, C, and N except a rare gas element, and more preferably, it is at least one kind selected from Al, Fe, C, and N. The content of the third element X in the SiOX thin film is more preferably within the range from 10 to 1000 ppm.

Note that the third element X in the SiOX thin film refers to an element intentionally added to the SiC-based target and an element taken from a gas during a film deposition process. Therefore, even if the SiOX thin film contains a minute amount of the aforesaid impurity element unavoidably contained in the SiC-based target, it does not depart from the spirit of the present invention. Constituent elements of the SiOX thin film can be analyzed by using a method such as ICP, RBS, or SIMS.

The SiOX film included in the low refractive-index dielectric film 19 can be stably formed without any process such as cleaning from the usage start to the usage end of the SiC-based target. Moreover, it is possible to prevent abnormal discharge from occurring while the SiOX film is deposited. Therefore, the phase-change optical recording medium 10 having the SioX film suffers little characteristic deterioration starting from the abnormal discharge, and characteristic variation among these media is also small. Further, sine the content of the third element X in the SiOX film is controlled within the range from 10 to 2000 ppm, the absorption of the film is small, which can realize a sufficient reflectance contrast. For these reasons, it is possible to provide the phase-change optical recording medium 10 with a high SN ratio of a reproduced signal. Further, it is possible to control the film texture of the low refractive-index dielectric film 19.

In order to obtain the SiOX film as described above, it is preferable to appropriately set conditions of the sputtering film deposition. As a discharge gas, usable is a mixed gas of a rare gas such as Ar and $O_2$, or a mixed gas of Ar, $O_2$, and $N_2$. As a sputtering method, applicable is RF sputtering, RF-superimposed DC sputtering, DC sputtering including pulse mode, DC sputtering, or the like.

Constituent materials of the high refractive-index dielectric films 18, 20 are not limited to a specific one, but it is preferable to use a material that is transparent and exhibits a high refractive index for a wavelength of recording/reproducing lights. As such a dielectric material, it is preferable to use a material whose major component is at least one kind selected from ZnS, GeN, GeCrN, CeO, $Cr_2O_3$, and $Ta_2O_5$, and it is more preferable to use a material whose major component is $ZnS-SiO_2$. Note that the same material as that of the high refractive-index dielectric films 18, 20 is used for the second dielectric film 14. As a constituent material of the metal reflection film 15, used is, for example, Ag, Al, Au, Cu, or an alloy mainly composed of these metals.

Next, a second embodiment of the optical recording medium of the present invention will be described. In the embodiment to be described here, the sputtering target and the manufacturing method of the optical thin film using the same in the above-described embodiments are applied to a write-once optical recording medium. The write-once optical recording medium may be a single-layer medium or may be a single-side dual-layer medium. When it is the single-layer medium, it has as its basic structure a substrate, a recording film, and a metal reflection film in the order from a light incident side.

FIG. 3 is a cross-sectional view showing a structure of one embodiment of the write-once optical recording medium of the present invention. A write-once optical recording medium 30 shown in FIG. 3 has a transparent substrate 31 such as a polycarbonate substrate disposed on the light incident side. On the transparent substrate 31, a first dielectric film 32, a recording film 33 to which irreversible recording is performed by light irradiation, a second dielectric film 34, a metal reflection film 35, and a third dielectric film 36 are stacked in this order. A laminated substrate 38 is laminated on the third dielectric film 36 via an ultraviolet curable resin layer 37. For the recording film 33, an azo-metal complex dye, a cyanine dye, or the like is usable. As the recording film 33, a film which irreversibly changes by light is usable and it may be an inorganic recording film of AlSi, Zn—S—Mg—O—Si, or the like.

Each of the first, second, and third dielectric films 32, 34, 36 includes the SiOX thin film deposited by sputtering the SiC-based target of the above-described embodiment in the oxygen-containing gas. Note that providing all of the dielectric films 32, 34, 36 is not necessarily essential. The write-once optical recording medium 30 may include one or two of the first, second, and third dielectric films 32, 34, 36. Positions where the dielectric films are disposed are appropriately changeable according to characteristics of the combined films and conditions such as an adopted linear velocity of the optical recording medium 30.

The SiOX thin film included in each of the dielectric films 32, 34, 36 contains Si and O as its major components, and the total content of the third element X other than the major components therein is controlled within the range from 10 to 2000 ppm (mass ratio). The X element is preferably at least one kind selected from Al, Fe, Zr, Sn, C, and N except a rare gas element, and more preferably at least one kind selected from Al, Fe, C, and N. The content of the third element X is more preferably within the range from 10 to 1000 ppm.

Note that the third element X in the SiOX thin film refers to an element intentionally added to the SiC-based target and an element taken from a gas during the film deposition process. Therefore, even if a minute amount of the aforesaid impurity element unavoidably contained in the SiC-based target is taken in the SiOX thin film, it does not depart from the spirit of the present invention. Constituent elements of the SiOX thin film can be analyzed by using a method such as ICP, RBS, or SIMS.

The SiOX film can be stably formed without any process such as cleaning from the usage start to the usage end of the SiC-based target. Further, it is possible to prevent abnormal discharge from occurring while the SiOX film is deposited. Therefore, the write-once optical recording medium 30 having the SiOX film suffers little characteristic deterioration starting from the abnormal discharge, and characteristic variation among these media is also small. Further, since the content of the third element X in the SiOX film is controlled within the range from 10 to 2000 pm, the absorption of the film is small, which can achieve a sufficient reflectance contrast. For these reasons, it is possible to provide the write-once optical recording medium 30 with a high SN ratio of a reproduced signal. Further, the film texture of the dielectric films 32, 34, 36 can be controlled.

In order to obtain the SiOX film as described above, it is preferable to appropriately set conditions of the sputtering film deposition. As a discharge gas, usable is a mixed gas of a rare gas such as Ar and $O_2$, or a mixed gas of Ar, $O_2$, and $N_2$. As a sputtering method, applicable is RF sputtering, RF-superimposed DC sputtering, DC sputtering including pulse mode, DC sputtering, or the like.

When the present invention is applied to a recording layer on an optical incident side of a single-side dual-layer medium, it has, as its basic structure, a substrate, a recording film, and a metal reflection film in the order from the light incident side. It is preferable to provide the aforesaid SiOX film on all or part of positions between the substrate and the recording film, between the recording film and the metal reflection film, and between the metal reflection film and a subsequent layer. When the present invention is applied to a recording layer that is positioned on a back side when seen from the light incident side of the single-side dual-layer medium, it has as its basic structure a bonding layer, a recording film, a metal reflection film, and a substrate from the optical incident side. The aforesaid SiOX film is preferably provided on all or part of positions between the bonding layer and the recording film, between the recording film and the metal reflection film, and between the metal reflection film and the substrate. A concrete structure and effects of the SiOC film are the same as those in the single-layer medium. Positions where the SiOX film is disposed can be appropriately changed depending on characteristics of the combined films and conditions such as an adopted linear velocity.

Next, concrete examples of the present invention and evaluation results thereof will be discussed. It should be noted that these examples are in no way to restrict the present invention.

EXAMPLES 1 TO 17

Sputtering Target

High-purity SiC powder and C powder, and Fe powder and Al powder to be added were mixed with an organic binder. Such a mixture was dispersed in a solvent to produce low-viscosity slurry. Next, using a pressure slip casting device, the aforesaid slurry was filled in a mold while being pressed, so that a molded body was fabricated. This molded body was air-dried, heated to a 600° C. temperature in an inert gas atmosphere, and defatted. Thereafter, it was heated to a temperature of 1400° C. or higher under a reduced pressure or in an inert gas atmosphere, and the heated molded body impregnated with melted metal Si was sintered. The resultant SiC-based sintered body was mechanically worked, thereby fabricating an intended sputtering target.

Each of the sputtering targets thus obtained was attached to a magnetron sputtering apparatus and was sputtered in a mixed gas of argon and oxygen, so that a SiOX film was deposited. An attenuation coefficient k of each of the resultant SiOX films was measured with a spectral ellipsometer. Further, long-hour continuous discharge was caused in order to test mass productivity of each of these sputtering targets, and the number of abnormal discharges occurring during this period was counted. Unlikelihood of the abnormal discharge during the film deposition was expressed as arcing resistance.

For evaluating the arcing resistance, conditions under which the abnormal discharge was more likely to occur were intentionally selected, and differences among the results obtained for respective materials were examined. In the evaluation of the arcing resistance, ♦ represents that no abnormal discharge occurred during a 30-minute period from the usage start of the target and during a 30-minute period before the usage limit, O represents that abnormal discharge occurred only once in each of the 30-minutes periods, Δ represents that abnormal discharge occurred twice to ten times in each of the 30-minute periods, and X represents that abnormal discharge occurred 10 times or more during each of the 30-minutes periods.

The measurement results of the attenuation coefficient k and the measurement results of the arcing resistance of the SiOX films deposited by sputtering are shown in Table 1 together with detected amounts of Al and Fe in the targets, bending strength of the targets. The contents of Al and Fe were quantified by ICP analysis. In the measurement, three sample pieces were extracted from each kind of the targets, and an average value of measured values for the three sample pieces is shown in each evaluation item. Variation in the measured values of the three sample pieces was about 2 ppm at the maximum. Note that a comparative example 1 in Table 1 is a conventional target containing Si and C as its major components and is a SiOX film deposited by using the same.

TABLE 1

| | Added Element [ppm] | | | Strength [MPa] | Attenuation Coefficient k | Arcing Resistance | |
|---|---|---|---|---|---|---|---|
| | Al | Fe | Total | | | Start | End |
| Example 1 | 6 | 5 | 11 | 1130 | 0 | ♦ | ♦ |
| Example 2 | 12 | — | 12 | 1262 | 0 | ♦ | ♦ |
| Example 3 | — | 9 | 9 | 1098 | 0 | ♦ | ♦ |
| Example 4 | 13 | 29 | 49 | 1020 | $1 \times 10^{-5}$ | ♦ | ♦ |
| Example 5 | 37 | 14 | 61 | 986 | $2 \times 10^{-5}$ | ♦ | ♦ |
| Example 6 | 20 | 45 | 81 | 912 | $4 \times 10^{-5}$ | ♦ | ♦ |
| Example 7 | 74 | 27 | 99 | 927 | $9 \times 10^{-5}$ | ♦ | ♦ |
| Example 8 | 35 | 68 | 103 | 883 | $9 \times 10^{-5}$ | ♦ | ♦ |
| Example 9 | 96 | — | 96 | 867 | $8 \times 10^{-5}$ | ♦ | ♦ |
| Example 10 | — | 102 | 102 | 891 | $8 \times 10^{-5}$ | ♦ | ♦ |
| Example 11 | 94 | 187 | 281 | 805 | 0.00047 | ♦ | O |
| Example 12 | 210 | 60 | 308 | 791 | 0.00091 | ♦ | O |
| Example 13 | 146 | 297 | 443 | 711 | 0.0011 | ♦ | O |
| Example 14 | 310 | 259 | 648 | 642 | 0.0015 | O | O |
| Example 15 | 249 | 548 | 797 | 520 | 0.0026 | O | O |
| Example 16 | 628 | 174 | 802 | 551 | 0.0053 | O | O |
| Example 17 | 871 | 45 | 916 | 505 | 0.0068 | O | O |
| Comparative Example 1 | 1673 | 478 | 2151 | 397 | 0.012 | Δ | X |

As is apparent from Table 1, the attenuation coefficient k is small in the SiOX films deposited by using the sputtering targets of the examples 1 to 17. Further, it is seen that the number of times the abnormal discharge occurred during the sputtering in these SiOX films is small from the usage start to the usage limit. Incidentally, it was confirmed from the texture observation of the targets of the examples 1 to 17 that each of them had the texture in which the Si phase continuously exists in the gaps among the SiC crystal grains in the net shape (network shape).

The measurement/evaluation of the average diameter of the free Si phase showed that the average diameter in any of the targets was 1000 nm or less. The content of the Si phase forming the network was within the range from 5 to 50 mass % in any of the targets. Moreover, as for the porosity and bending strength, appropriate values were obtained in these targets. On the other hand, according to the comparative example 1, the target contained a large amount of Al and Fe, and the average diameter of the free Si phase exceeded 1000 nm. The attenuation coefficient k of a resultant film was large and the number of times the abnormal discharge occurred was also large.

EXAMPLE 18

Sputtering Target

A SiC-based target was fabricated in the same manner as that for the example 1 except that Zr and Sn were added in addition to Al and Fe. ICP analysis for examining an amount of the third element in the target showed that the Al content was 456 ppm, the Fe content was 412 ppm, the Zr content was 951 ppm, the Sn content was 125 ppm, and the total amount of these elements was 1944 pm. It was confirmed from the texture observation of the target that the target had the texture in which the Si phase continuously exists in the gaps among the SiC crystal grains in the net shape. The average diameter of the Si phase was 1000 nm or less and the content of the Siphase was within the range from 5 to 50 mass %. As for the porosity and bending strength, appropriate values were obtained in the target.

A SiOX film was deposited in the same manner as that for the example 1 by using this SiC-based target. The attenuation coefficient k of the resultant SiOX film was $9.4 \times 10^{-3}$. Moreover, the arcing resistance was evaluated as O both in the 30-minute period from the usage start of the target and the 30-minute period before the usage limit thereof.

EXAMPLES 19 TO 25

Sputtering Target

In the fabrication process of the SiC-based target, the average grain size of SiC powder and C powder, fabrication conditions of the molded body, and soon were varied, thereby varying the average diameter of the Si phase existing in the gaps among the SiC crystal grains. Such sputtering targets were sputtered in the same manner as that for the example 1, and the arcing resistance was measured and evaluated. Table 2 shows the evaluation results of the average diameter of the Si phase, porosity, bending strength, and arcing resistance of the respective sputtering targets.

TABLE 2

|  | Average Diameter of Si Phase [nm] | Porosity [%] | Strength [MPa] | Arcing Resistance Start | Arcing Resistance End |
|---|---|---|---|---|---|
| Example 19 | 102 | 1.1 | 1230 | ◆ | ◆ |
| Example 20 | 76 | 0.8 | 1015 | ◆ | ◆ |
| Example 21 | 34 | 0.6 | 964 | ◆ | ◆ |
| Example 22 | 16 | 0.3 | 875 | ◆ | ◆ |
| Example 23 | 349 | 2.6 | 953 | ◆ | ○ |
| Example 24 | 813 | 3.8 | 715 | ◆ | ○ |
| Example 25 | 993 | 4.7 | 502 | ◆ | ○ |
| Comparative Example 2 | 2461 | 7.5 | 410 | Δ | X |

As is apparent from Table 2, when the average diameter of the Si phase continuously existing in the gaps among the SiC crystal grains in the net shape is controlled to 1000 nm or less, it is possible to enhance the strength and density of the SiC-based target with good repeatability. Moreover, the number of times the abnormal discharge occurs while the SiC-based target is sputtered can be reduced with good repeatability. The total amount of the third element in each of the SiC-based targets of the examples 19 to 25 was within the range from 10 to 2000 ppm. On the other hand, as for the sputtering target of a comparative example 2 in which the average diameter of the Si phase exceeds 1000 nm, it is seen that its strength is low and the number of times the abnormal discharge occurs during the sputtering is larger.

EXAMPLES 26 TO 30

Sputtering Target

In the fabrication process of the SiC-based target, the average grain size of the SiC powder and the C powder, fabrication conditions of the molded body, and so on were varied, thereby varying the content of the Si phase existing in the gaps among the SiC crystal grains. Such sputtering targets were sputtered in the same manner as that for the example 1, and the arcing resistance was measured and evaluated. Table 3 shows the evaluation results of the content of the Si phase, porosity, bending strength, and arcing resistance of the respective sputtering targets.

TABLE 3

|  | Si Content [mass %] | Porosity [%] | Strength [MPa] | Arcing Resistance Start | Arcing Resistance End |
|---|---|---|---|---|---|
| Example 26 | 5 | 0.9 | 950 | ◆ | ◆ |
| Example 27 | 13 | 0.6 | 1059 | ◆ | ◆ |
| Example 28 | 25 | 1.2 | 1178 | ◆ | ◆ |
| Example 29 | 37 | 2.3 | 846 | ◆ | ○ |
| Example 30 | 50 | 4.9 | 506 | ◆ | ○ |
| Reference Example 1 | 67 | 6.7 | 381 | Δ | X |
| Reference Example 2 | 2 | 9.2 | 428 | Δ | X |

As is apparent from Table 3, when the content of the Si phase continuously existing in the gaps among the SiC crystal grains in the net shape is controlled within the range from 5 to 50 mass %, the strength and density of the SiC-based target can be further increased with good repeatability. Moreover, it is possible to reduce, with good repeatability, the number of times the abnormal discharge occurs while the SiC-based target is sputtered. The total amount of the third element in each of the SiC-based targets of the examples 26 to 30 was within the range from 10 to 2000 ppm. It is also seen that too large a content and too small a content of the Si phase result in strength deterioration. Further, they also result in the increase in the number of times the abnormal discharge occurs during the sputtering.

EXAMPLES 31 TO 47

Phase-change Optical Recording Medium

Optical recording media having the structure shown in FIG. 2 were fabricated as follows. First, as each transparent substrate 11, a polycarbonate substrate with a 0.6 mm thickness was prepared. Grooves with a 40 nm depth are formed on the transparent substrate 11 at a 0.68 μm pitch. In the case of land/groove recording, the track pitch becomes 0.34 μm. Hereinafter, a groove track refers to a track which is closer to a light incident surface, and a land track refers to a track which is farther from the light incident surface.

The following films were deposited on the transparent substrate 11 in the order from the light incident side.

high refractive-index dielectric film 18: a ZnS—SiO$_2$ film (thickness=30 nm)
low refractive-index dielectric film 19: a SiOX film (thickness=60 nm)
high refractive-index dielectric film 20: a ZnS—SiO$_2$ film (thickness=25 nm)
phase-change recording film 13: a GeSbTeBi film (thickness=13 nm)
second dielectric film 14: a ZnS—SiO$_2$ film (thickness=20 nm)
reflection film 15: an Ag alloy film (thickness=100 nm)

Here, the first dielectric film 12 provided on the light incident side of the phase-change recording film 13 was constituted of a multilayer film of the high refractive-index film 18/low refractive-index dielectric film 19/high refractive-index dielectric film 20. Note that each of the ZnS—SiO$_2$ films used as the high refractive-index dielectric films contains a mixture of ZnS and SiO$_2$. The SiOX films used as the low refractive-index dielectric film 19 were deposited by using the sputtering targets of the aforesaid examples 1 to 17 respectively. The sputtering was carried out in a mixed gas of argon and oxygen. Further, after ultraviolet curable resin was applied by a spin coating method, the polycarbonate substrate 17 with a 0.6 mm thickness was laminated thereon and the resin was optically cured. Table 4 shows the type of discharge occurring while each of the low refractive-index dielectric films (SiO films) was deposited and detected amounts of the third elements in each of the SiOX films.

TABLE 4

| kind of target | Discharge Type | Element Amount in Film [ppm] | | | | |
|---|---|---|---|---|---|---|
| | | Al | Fe | C | N | total |
| Example 31 | SiC target of Example 1 | RF | 7 | 5 | — | — | 12 |
| Example 32 | SiC target of Example 2 | DC | 5 | — | 6 | — | 11 |
| Example 33 | SiC target of Example 3 | RF | 9 | — | — | — | 9 |
| Example 34 | SiC target of Example 4 | DC | 7 | 15 | 7 | — | 29 |
| Example 35 | SiC target of Example 5 | DC | 18 | 11 | 9 | — | 38 |
| Example 36 | SiC target of Example 6 | RF | 24 | 27 | — | — | 51 |
| Example 37 | SiC target of Example 7 | DC | 34 | 18 | 11 | 8 | 79 |
| Example 38 | SiC target of Example 8 | RF | 29 | 27 | 31 | — | 87 |
| Example 39 | SiC target of Example 9 | RF | 60 | 35 | 15 | — | 100 |
| Example 40 | SiC target of Example 10 | DC | 31 | 78 | 28 | — | 147 |
| Example 41 | SiC target of Example 11 | RF | 147 | 91 | — | — | 238 |
| Example 42 | SiC target of Example 12 | DC | 98 | 213 | 48 | — | 359 |
| Example 43 | SiC target of Example 13 | RF | 189 | 145 | 168 | 31 | 502 |
| Example 44 | SiC target of Example 14 | RF | 274 | 196 | 97 | 81 | 648 |
| Example 45 | SiC target of Example 15 | DC | 534 | 121 | 142 | 107 | 804 |
| Example 46 | SiC target of Example 16 | DC | 315 | 247 | 230 | — | 792 |
| Example 47 | SiC target of Example 17 | RF | 891 | 64 | 21 | — | 976 |
| Comparative Example 3 | SiC target of Comparative Example 1 | RF | 1051 | 523 | 363 | 151 | 2088 |
| Comparative Example 4 | SiO$_2$ target | RF | 3 | — | 2 | — | 5 |

Each of the phase-change optical recording media was placed in an initializing apparatus and was irradiated with an oval beam with a 50 μm width and a 1 μm length, thereby initializing (crystallizing) the whole surface of the recording film. Prior to the evaluation of disk characteristics of the optical recording media, reflectance was measured. The measurement result showed that a reflectance difference between a crystalline portion and an amorphous portion was about 15% or more, which means that disks with a large contrast were obtained. Recording/erase tests for such optical recording media were conducted as follows. In the recording/erase tests, used was an optical disk evaluation apparatus including a pickup which has an objective lens with NA=0.65 and a semiconductor laser with a 405 nm wavelength. In the recording test, the recording linear velocity was set to 5.6 m/sec and a 9T (T is an index representing the length of a signal) signal (its mark length and space length were both 0.78 μm) was used.

A test method was as follows. In the experiments for evaluating characteristics of a land or groove track, consideration was given so that a signal written to another track does not influence the relevant track. CNR (Carrier to Noise Ratio) and a cross erase characteristic were measured in the following manner. First, recording-power dependency and erase-power dependency of CNR were measured, thereby finding the optimum powers. Next, a random pattern was overwritten to the land or groove track with the optimum power ten times, and the 9T signal was further written. At this instant, CNR of the 9T signal on this track was measured. Further, the 9T signal was recorded to an unrecorded track with the optimum power and a continuous erase light was emitted thereon. In this manner, it was measured how much a carrier value changes before and after the irradiation of the erase power, and a change amount thereof was defined as an erase ratio ER (DC erase ratio).

Further, in order to evaluate reliability of the optical recording media, the fabricated optical recording media were exposed to an environment of an 85° C. temperature and an 85% relative humidity for 300 hours, and thereafter, the same experiments as above were conducted. CNR after the environment test was measured. Table 5 shows CNR, erase ratio ER, and CNR after the environment test of the optical recording media each including the low refractive-index dielectric film (SiOX film) which was deposited at the usage start time of the sputtering target and the optical recording media each including the low refractive-index dielectric film (SiOX film) which was deposited before the usage limit.

TABLE 5

| | Usage Start Time | | Usage End Time | | Environment Test |
|---|---|---|---|---|---|
| | CNR [dB] | ER [dB] | CNR [dB] | ER [dB] | CNR [dB] |
| Example 31 | 55.1 | 33.2 | 54.9 | 33.1 | 54.0 |
| Example 32 | 54.5 | 32.8 | 54.2 | 32.0 | 52.6 |
| Example 33 | 54.1 | 33.0 | 53.9 | 32.9 | 52.9 |
| Example 34 | 54.7 | 32.7 | 54.0 | 32.3 | 52.7 |
| Example 35 | 54.8 | 32.8 | 54.0 | 32.1 | 53.1 |
| Example 36 | 54.6 | 32.4 | 54.2 | 32.0 | 53.8 |
| Example 37 | 55.1 | 32.6 | 53.7 | 31.9 | 52.9 |
| Example 38 | 54.5 | 32.4 | 54.1 | 32.3 | 52.2 |
| Example 39 | 54.7 | 32.5 | 54.5 | 32.1 | 52.1 |
| Example 40 | 54.1 | 32.2 | 53.5 | 31.6 | 51.9 |
| Example 41 | 54.2 | 32.0 | 53.4 | 31.4 | 52.5 |
| Example 42 | 53.9 | 31.9 | 52.6 | 31.0 | 51.4 |
| Example 43 | 53.5 | 31.5 | 51.9 | 30.4 | 50.8 |
| Example 44 | 52.9 | 31.7 | 51.4 | 30.6 | 50.9 |
| Example 45 | 52.5 | 31.4 | 50.5 | 30.1 | 50.1 |
| Example 46 | 52.7 | 31.1 | 50.7 | 30.0 | 50.3 |
| Example 47 | 51.9 | 31.3 | 50.8 | 30.2 | 50.1 |

TABLE 5-continued

| | Usage Start Time | | Usage End Time | | Environment Test |
|---|---|---|---|---|---|
| | CNR [dB] | ER [dB] | CNR [dB] | ER [dB] | CNR [dB] |
| Comparative Example 3 | 50.1 | 30.5 | 44.5 | 24.8 | 42.8 |
| Comparative Example 4 | (no test conducted) | | | | |

As is apparent from Table 5, the optical recording media of the examples 31 to 47 all stably exhibited good characteristics from the usage start to the usage limit of the target. Further, they also exhibited good characteristics after the environment test. On the other hand, it is seen that an amount of the third element is large in the film of a comparative example 3 whose low refractive-index dielectric film was deposited by using the conventional target (comparative example 1). In this case, abnormal discharge gradually occurs many times during the deposition. Therefore, as for the optical recording medium fabricated before the usage limit of the target, good values were not obtainable, CNR being 44.5 dB, ER being 24.8 dB. CNR after the environment test. was 42.8 dB.

In a comparative example 4, the low refractive-index dielectric film was deposited by using a high-purity $SiO_2$ target instead of the target containing Si and C as its major components. Being low in deposition rate and in mass productivity, this method is not worth the cost. Therefore, an attempt was made to fabricate an optical recording medium by applying power twice as high as conventional power. However, the substrate was greatly deformed due to a great increase in its temperature, so that a satisfactory optical recording medium was not obtainable.

EXAMPLE 48

Phase-Change Optical Recording Medium

A phase-change optical recording medium was fabricated in the same manner as that for the example 31 except that the sputtering target of the example 18 was used for depositing the low refractive-index dielectric film. When amounts of the third elements in the low refractive-index dielectric film (SiOX film) were quantified by ICP analysis, an Al amount was 512 ppm, a Fe amount was 468 ppm, a Zr amount was 843 pm, a Sn amount was 142 ppm, a C amount was 15 ppm, and the total amount of these elements was 1980 ppm. Further, characteristics of the phase-change optical recording medium were measured and evaluated in the same manner as that for the example 31. As a result, in the optical recording medium fabricated at the usage start of the target, CNR was 51.5 dB and ER was 31.4 dB. In the optical recording medium fabricated before the usage limit of the target, CNR was 50.9 dB, ER was 31.1 dB. CNR after the environment test was 50.5 dB.

EXAMPLES 49 TO 65

Phase-Change Optical Recording Medium

Optical recording media having the structure shown in FIG. 2 were fabricated as follows. A polycarbonate with a 0.6 mm thickness similar to that of the example 30 was prepared as each transparent substrate 11. The following films were deposited on the transparent substrate 11 in the order from the light incident side.

high refractive-index dielectric film 18: a ZnS—$SiO_2$ film (thickness=30 nm)
low refractive-index dielectric film 19: a SiOX film (thickness=55 nm)
high refractive-index dielectric film 20: a ZnS—$SiO_2$ film (thickness=24 nm)
phase-change recording film 13: a GeBiTe film (thickness=11 nm)
second dielectric film 14: a ZnS—$SiO_2$ film (thickness=25 nm)
reflection film 15: an Ag alloy film (thickness=100 nm)

SiOX films used as the low refractive-index dielectric film 19 were deposited by using the sputtering targets of the aforesaid examples 1 to 17 respectively. The sputtering was carried out in a mixed gas of argon and oxygen. Table 6 shows the type of discharge occurring while each of the low refractive-index dielectric films (siOC films) was deposited and also shows detected amounts of the third elements in the SiOX films. Further, characteristics of each of the phase-change optical recording media were measured and evaluated in the same manner as that for the example 30. Table 7 shows the results.

TABLE 6

| | Kind of Target | Discharge Type | Element Amount in Film [ppm] | | | | |
|---|---|---|---|---|---|---|---|
| | | | Al | Fe | C | N | Total |
| Example 49 | SiC target of Example 1 | RF | 7 | 6 | — | — | 13 |
| Example 50 | SiC target of Example 2 | DC | 5 | — | 5 | — | 10 |
| Example 51 | SiC target of Example 3 | DC | 8 | — | — | — | 8 |
| Example 52 | SiC target of Example 4 | RF | 15 | 10 | 4 | — | 29 |
| Example 53 | SiC target of Example 5 | RF | 34 | 7 | 11 | — | 52 |
| Example 54 | SiC target of Example 6 | DC | 26 | 18 | 15 | 8 | 67 |
| Example 55 | SiC target of Example 7 | RF | 54 | 22 | 9 | — | 85 |
| Example 56 | SiC target of Example 8 | RF | 26 | 41 | 31 | — | 98 |
| Example 57 | SiC target of Example 9 | DC | 74 | 19 | — | — | 103 |
| Example 58 | SiC target of Example 10 | RF | 64 | — | 32 | — | 96 |
| Example 59 | SiC target of Example 11 | DC | 107 | 57 | 12 | — | 176 |
| Example 60 | SiC target of Example 12 | RF | 135 | 81 | 24 | 11 | 294 |
| Example 61 | SiC target of Example 13 | DC | 218 | 198 | 94 | 33 | 543 |
| Example 62 | SiC target of Example 14 | RF | 343 | 219 | 133 | — | 695 |
| Example 63 | SiC target of Example 15 | DC | 178 | 585 | 27 | — | 790 |
| Example 64 | SiC target of Example 16 | DC | 421 | 129 | 140 | 121 | 801 |
| Example 65 | SiC target of Example 17 | RF | 824 | 102 | 18 | — | 944 |
| Comparative Example 5 | SiC target of Comparative Example 1 | RF | 741 | 424 | 263 | 52 | 1480 |
| Comparative Example 6 | $SiO_2$ target | RF | 5 | — | 3 | — | 8 |

TABLE 7

| | Usage Start Time | | Usage End Time | | Environment Test |
|---|---|---|---|---|---|
| | CNR [dB] | ER [dB] | CNR [dB] | ER [dB] | CNR [dB] |
| Example 49 | 55.0 | 32.9 | 54.5 | 32.7 | 53.9 |
| Example 50 | 55.3 | 32.6 | 54.9 | 32.0 | 54.1 |
| Example 51 | 54.8 | 32.9 | 54.5 | 32.4 | 54.0 |

TABLE 7-continued

|  | Usage Start Time | | Usage End Time | | Environment Test |
|---|---|---|---|---|---|
|  | CNR [dB] | ER [dB] | CNR [dB] | ER [dB] | CNR [dB] |
| Example 52 | 54.9 | 32.7 | 53.9 | 31.9 | 53.6 |
| Example 53 | 54.7 | 32.5 | 54.0 | 31.7 | 52.9 |
| Example 54 | 54.5 | 32.4 | 53.7 | 31.6 | 53.3 |
| Example 55 | 54.6 | 32.2 | 53.8 | 31.1 | 53.0 |
| Example 56 | 54.4 | 32.0 | 53.4 | 31.5 | 53.2 |
| Example 57 | 53.9 | 33.1 | 52.9 | 31.8 | 52.1 |
| Example 58 | 54.0 | 32.5 | 52.8 | 31.6 | 51.9 |
| Example 59 | 53.5 | 32.0 | 52.4 | 31.7 | 50.8 |
| Example 60 | 53.2 | 31.9 | 52.1 | 30.8 | 51.0 |
| Example 61 | 52.6 | 31.5 | 51.9 | 30.4 | 50.5 |
| Example 62 | 52.1 | 31.7 | 51.4 | 30.7 | 50.4 |
| Example 63 | 51.7 | 31.4 | 50.9 | 30.2 | 50.1 |
| Example 64 | 51.5 | 31.1 | 50.6 | 30.1 | 50.3 |
| Example 65 | 50.8 | 30.6 | 50.1 | 30.0 | 50.0 |
| Comparative Example 5 | 50.7 | 30.1 | 45.9 | 26.1 | 42.9 |
| Comparative Example 6 | (no test conducted) | | | | |

As is apparent from Table 7, the optical recording media of the examples 49 to 65 all stably exhibited good characteristics from the usage start to the usage limit of the target, and also exhibited good characteristics after the environment test. On the other hand, in a comparative example 5 in which the low refractive-index dielectric film was deposited by using the conventional target, it is seen that amounts of the third elements in the film are large. In this case, abnormal discharge gradually occurs many times during the film deposition. Therefore, in the optical recording medium fabricated before the usage limit of the target, good values were not obtainable, CNR being 45.9 dB, ER being 26.1 dB. CNR after the environment test was 42.9 dB. Further, in a comparative example 6, the low refractive-index dielectric film was deposited by using a high-purity $SiO_2$ target as in the comparative example 4, and it exhibited the same results as those of the example 4.

EXAMPLE 66

Phase-Change Optical Recording Medium

A phase-change optical recording medium was fabricated in the same manner as that for the example 49 except that a sputtering target with Zr and Sn as well as Al and Fe added thereto was used for depositing the low refractive-index dielectric film as in the example 18. When amounts of the third elements in the low refractive-index dielectric film (SiOX film) were quantified, an Al amount was 402 ppm, a Fe amount was 496 ppm, a Zr amount was 687 ppm, a Sn amount was 103 pm, a C amount was 28 ppm; and the total amount of these elements was 1716 ppm. Further, characteristics of the phase-change optical recording medium was measured and evaluated in the same manner as that for the example31. As a result, in the optical recording-medium fabricated at the usage start of the target, CNR was 50.9 dB and ER was 31.1 dB. In the optical recording medium fabricated before the usage limit of the target, CNR was 50.5 dB and ER was 30.7 dB. A characteristic CNR after the environment test was 50.2 dB.

EXAMPLES 67 TO 70

Write-Once Optical Recording Medium

Write-once optical recording media having the structure shown in FIG. 3 were fabricated in the following manner. First, a polycarbonate substrate with a 0.6 mm thickness was prepared as each transparent substrate 31. Grooves with a 60 nm depth were formed on the transparent substrate 31 at a 0.4 µm pitch for groove recording. Hereinafter, a groove track refers to a track which is closer to the light incident surface.

The following films were deposited on the transparent substrate 31 in the order from the light incident side. The example 67 was made to have a structure of a SiOX film (thickness=20 nm) 32/an organic dye film (thickness=50 nm) 33/an Ag alloy film (thickness=30 nm) 35. The example 68 was made to have a structure of an organic dye film (thickness=50 nm) 33/a SiO film (thickness=40 nm) 34/an Ag alloy film (thickness=40 nm) 35. The example 69 was made to have a structure of an organic dye film (thickness=50 nm) 33/an Ag alloy film (thickness=40 nm) 35/a SiOX film (thickness=100 nm) 36. The example 70 was made to have a structure of a SiOX film (thickness=20 nm) 32/an organic dye film (thickness=50 nm) 33/a SiOX film (thickness=30 nm) 32/an Ag alloy film (thickness=40 nm) 35/a SiOX film (thickness=30 nm) 36.

The organic dye film was formed by spin coating. The SiOX film was deposited in a mixed gas of argon and oxygen by using the sputtering target of the aforesaid examples. The Ag alloy film was deposited by sputtering an Ag alloy in Ar. Further, after ultraviolet curable resin was applied by a spin coating method, a polycarbonate substrate with a 0.6 mm thickness was laminated thereon, and the resin was optically cured. When the films deposited under the same process conditions as those for depositing the SiOX films used in the examples 67 to 70 were analyzed, detected amounts of the third elements other than Si and O were 38 ppm for Al, 12 ppm for Fe, and 35 ppm for C.

Recording/erase tests for the above-described write-once optical recording media were conducted in the following manner. In the tests, used was an optical disk evaluation apparatus including a pickup which has an objective lens with NA=0.65 and a semiconductor laser with a 405 nm wavelength. In the recording test, the recording linear velocity was set to 6.61 m/sec and a 3T signal (its mark length and space length were 0.306 µm) was used. The reason why the 3T signal was used is that influence of jitter on mark ends prominently appears owing to its short mark length, which facilitates superiority comparison of the media.

CNR (Carrier to Noise Ratio) of each of the optical recording media of the respective examples was measured (CNR-A). Further, in order to evaluate reliability of the optical recording media, after the optical recording media were exposed to an environment of an 85° C. temperature and an 85% relative humidity for 300 hours, the same test as above was conducted and CNR was measured (CNR-B). Table 8 shows the measurement results.

TABLE 8

|  | CNR-A [dB] | CRN-B [dB] |
|---|---|---|
| Example 67 | 52.5 | 52.2 |
| Comparative Example 7 | 52.5 | 38.2 |
| Example 68 | 52.8 | — |
| Comparative Example 8 | 43.0 | — |
| Example 69 | 53.2 | — |
| Example 70 | 54.8 | — |
| Comparative Example 9 | 51.0 | — |
| Comparative Example 10 | 52.2 | — |
| Comparative Example 11 | 53.1 | — |
| Comparative Example 12 | 52.6 | — |

As is apparent from Table 8, the example 67 exhibited a good initial characteristic, and also exhibited a good characteristic after the environment test since the SiOX film 32 provided between the substrate 31 and the organic dye film 33 suppresses the reaction of the dye and the substrate. Meanwhile, as a comparative example 7, an optical recording medium was fabricated in which no SiOX film 32 was provided between the substrate 31 and the organic dye film 33. The evaluation of characteristics of this optical recording medium showed that CNR before the environment test was as good as 52.5 dB but CNR after the environment test was lowered to 38.2 dB. This can verify the effect of the optical recording medium in which the SiOX film 32 is provided on an interface between the substrate 31 and the organic dye film 33.

In the example 68, the thickness of the Ag alloy film 35 was reduced to 40 nm, thereby saving resources to reduce cost. As is apparent from the measurement result of CNR-A for the example 68 shown in Table 8, high CNR was obtained. This is because the SiOX film 34 compensated reduced heat conduction ascribable to the thickness reduction of the Ag alloy film 35. On the other hand, as a comparative example 8, an optical recording medium was fabricated in which no SiOX film 34 was provided and only an organic dye film (thickness 50 nm) and an Ag alloy film (thickness 40 nm) were provided. When the initial CNR of this medium was measured, only 43 dB was obtained. This is because the shape of marks was deformed due to the insufficient heat conduction.

In the example 69, the arrangement order of the SiOX film and the Ag alloy film was changed from that in the example 68. In this case, high CNR was also obtained because the SiOX film compensated the reduced heat conduction ascribable to the thickness reduction of the Ag alloy film. The example 70 is a medium in which the thickness of the Ag alloy film 35 was reduced and the SiOX films 32, 34, 36 were disposed between the substrate 31 and the organic dye film 33, between the organic dye film 33 and the Ag alloy film 35, and between the Ag alloy film and a subsequent layer. The effects of the SiOX films 34, 36 provided on upper and lower sides of the Ag alloy film 35 were capable of compensating the reduced heat conduction due to the further thickness reduction of the Ag alloy film 35, so that good initial CNR (CNR-A) was obtained. Further, owing to the effect of the SiOX film 32 provided between the substrate 31 and the organic dye film 33, good CNR (CNR-B) after the environment test was also obtained.

As comparative examples 9 to 12, write-once optical recording media were fabricated in the same manners as those for the examples 68 to 71 except that the conventional sputtering target containing Si and C as its major components was used for depositing the SiOX film. The film structures of the comparative examples 9 to 12 are the same as those of the examples 67 to 70, and only the SiOX film is different. When films deposited under the same process conditions as those for the SiOX film used in the examples 9 to 12 were analyzed, detected amounts of the third elements other than Si and O were 851 ppm for Al, 742 ppm for Fe, and 1268 ppm for C. It is seen that the initial CNR of all of the comparative examples 9 to 12 is lower than that of the examples 67 to 70. This is because of light absorption ascribable to the third elements. Incidentally, when a sputtering target in which the average diameter of the Si phase was large was used, because it tends to cause the SiOX film to include a defect due to abnormal discharge occurring during the sputtering, noise level of the media was high.

EXAMPLE 71

Antireflection Film

The SiOX films of the above-described examples are applicable to, for example, an antireflection film. Here, commonly used glass was used as a substrate, and a SiOX film as the low refractive-index film and a $TiO_2$ film as the high refractive-index film were deposited by sputtering. The SiOX film as the low refractive-index film was deposited by using the sputtering target of any of the examples. Such a multilayer film was set in a spectrophotometer and a reflectance spectrum was measured. As a result, it was confirmed that reflectance was sufficiently low for light in the visible spectrum.

Further, the high mechanical strength of the sputtering target of the example allows the application of high power. As a result, a high deposition rate is achieved. In addition, since it adheres to the substrate or a base film with high energy, a film high in adhesion strength can be obtained. Controlling the sputtering process makes it possible to alleviate a film stress. Further, controlling the film texture by the sputtering process makes it possible to enhance adhesiveness with a film stacked subsequently on the SiOX film.

It should be noted that the present invention is not limited to the embodiments described above, but various modifications can be made without departing from the spirit of the present invention when the present invention is embodied. Further, various inventions can be formed by appropriately combining a plurality of constituent elements disclosed in the above-described embodiments. For example, some of the constituent elements may be deleted from all the constituent elements shown in the embodiments. Further, constituent elements shown in different embodiments may be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sputtering target containing silicon (Si) and carbon (C) as major components, comprising:
   a texture having silicon carbide (SiC) crystal grains and a silicon (Si) phase which continuously exists in a net shape in gaps among the silicon carbide (SiC) crystal grains and whose average diameter is 1000 nm or less,
   wherein a third element other than the major components is contained in the sputtering target, a total amount of the third element being within a range from 10 to 2000 ppm.

2. The sputtering target as set forth in claim 1, wherein a content ratio of the Si (silicon) phase in the sputtering target is within a range from 5 mass % to 50 mass %.

3. The sputtering target as set forth in claim 1, wherein the sputtering target comprises a sintered body having the texture.

4. The sputtering target as set forth in claim 1, wherein the sputtering target comprises a sintered body having the texture and formed by a reactive sintering.

5. The sputtering target as set forth in claim 1, wherein porosity of the sputtering target is 5% or less.

6. The sputtering target as set forth in claim 1, wherein a bending strength of the sputtering target is 500 MPa or more.

7. The sputtering target as set forth in claim 1, wherein the third element is a metal element functioning as a sintering aid of silicon carbide (SiC).

8. The sputtering target as set forth in claim 1, wherein the third element is at least one selected from aluminum (Al), iron (Fe), zirconium (Zr), and tin (Sn).

9. The sputtering target as set forth in claim 1,
wherein the sputtering target is used for depositing a thin film containing silicon (Si) and oxygen (O) as major components.

10. A sputtering target including silicon (Si) and carbon (C) as major components, the sputtering target comprising:
a texture including silicon carbide (SiC) crystal grains and a silicon (Si) phase in gaps among the silicon carbide (SiC) crystal grains and whose average diameter is 1000 nm or less,
wherein a third element other than the major components is included in the sputtering target, a total amount of the third element being within a range from 10 to 2000 ppm.

* * * * *